(12) United States Patent
Hur

(10) Patent No.: US 7,852,139 B2
(45) Date of Patent: Dec. 14, 2010

(54) APPARATUS FOR GENERATING INTERNAL VOLTAGE IN SEMICONDUCTOR INTEGRATED CIRCUIT

(75) Inventor: Young-Do Hur, Ichon (KR)

(73) Assignee: Hynix Semiconductor Inc. (KR)

( * ) Notice: Subject to any disclaimer, the term of this patent is extended or adjusted under 35 U.S.C. 154(b) by 27 days.

(21) Appl. No.: 11/962,940

(22) Filed: Dec. 21, 2007

(65) Prior Publication Data

US 2008/0315937 A1 Dec. 25, 2008

(30) Foreign Application Priority Data

Jun. 22, 2007  (KR) ........... 10-2007-0061567

(51) Int. Cl.
*G11C 5/14* (2006.01)
(52) U.S. Cl. .............. 327/530; 327/157; 327/534; 327/540
(58) Field of Classification Search ........ 327/157, 327/536, 530, 534–537, 540, 541
See application file for complete search history.

(56) References Cited

U.S. PATENT DOCUMENTS

| | | | |
|---|---|---|---|
| 6,198,341 B1 * | 3/2001 | Ryu | ............ 327/536 |
| 6,597,603 B2 | 7/2003 | Lambrache et al. | |
| 6,654,296 B2 * | 11/2003 | Jang et al. | ............ 365/189.09 |
| 7,362,164 B2 * | 4/2008 | Kang | ............ 327/536 |
| 2006/0273844 A1 | 12/2006 | Lee | |
| 2006/0290412 A1 * | 12/2006 | Jung et al. | ............ 327/536 |
| 2008/0024203 A1 * | 1/2008 | Lee et al. | ............ 327/536 |

FOREIGN PATENT DOCUMENTS

| | | |
|---|---|---|
| JP | 2003-272396 | 9/2003 |
| KR | 10-1998-0015331 | 5/1998 |
| KR | 1020020078971 A | 10/2002 |
| KR | 1020060053429 A | 5/2006 |

* cited by examiner

*Primary Examiner*—Lincoln Donovan
*Assistant Examiner*—Shikha Goyal
(74) *Attorney, Agent, or Firm*—Baker & McKenzie LLP

(57) ABSTRACT

An apparatus for generating an internal voltage in a semiconductor integrated circuit includes a first voltage generating unit configured to detect a feedback voltage level of a first internal voltage and perform a pumping operation, thereby generating a first internal voltage, and a second voltage generating unit configured to generate a second internal voltage by detecting a feedback voltage level of the second internal voltage, performing level shifting on the detected feedback voltage level, receiving the first internal voltage, and generating the second internal voltage based on the level shifted feedback voltage signal and the received first internal voltage.

16 Claims, 3 Drawing Sheets

APPARATUS FOR GENERATING INTERNAL VOLTAGE IN SEMICONDUCTOR INTEGRATED CIRCUIT

CROSS-REFERENCE TO RELATED PATENT APPLICATION

This application claims the benefit under 35 U.S.C 119(a) of Korean Patent Application No. 10-2007-0061567, filed on Jun. 22, 2007, in the Korean Intellectual Property Office, the disclosure of which is incorporated herein in its entirety by reference as if set forth in full.

BACKGROUND

1. Technical Field

The embodiments described herein relate to a semiconductor integrated circuit and, more particularly, to an apparatus for generating an internal voltage in a semiconductor integrated circuit that increases area efficiency.

2. Related Art

A conventional semiconductor integrated circuit receives power sources, such as an external supply voltage VDD and a ground voltage VSS, and generates an internal voltage, such as an elevated internal voltage VPP and a substrate bias voltage VBB. At this time, the semiconductor integrated circuit sets a target level of the internal voltage and detects whether the internal voltage exceeds the target level. If the internal voltage does not reach the target level, the internal voltage is often pumped to maintain the target level. In order to perform such a function, the semiconductor integrated circuit includes an apparatus for generating the internal voltage. The apparatus includes a voltage detecting unit, an oscillating unit and a voltage pumping unit.

Conventionally, a substrate bias voltage VBB is mainly used as a bulk voltage for NMOS transistors, which is needed to reduce a leakage current. Also, the substrate bias voltage VBB can be applied to a gate terminal of PMOS transistors to overcome a threshold voltage for the PMOS transistors. The substrate bias voltage VBB can be used in a circuit such as a sub word line driver in a conventional semiconductor memory apparatus. Since the characteristics of NMOS transistors are different from that of PMOS transistors. For example, the substrate bias voltage level used for NMOS transistors (hereinafter, referred to as "N-substrate bias voltage") is different from the substrate bias voltage level used for PMOS transistors (hereinafter, referred to as "P-substrate bias voltage").

In order to generate the N-substrate bias voltage and the P-substrate bias voltage, each of which is at a different level, a conventional semiconductor integrated circuit includes both a voltage generator for the N-substrate bias voltage and another voltage generator for the P-substrate bias voltage. That is, a conventional semiconductor integrated circuit includes a voltage detecting unit, a ring oscillating unit and a voltage pumping unit for generating the N-substrate bias voltage and a voltage detecting unit, a ring oscillating unit and a voltage pumping unit for generating the P-substrate bias voltage. Since the apparatus for generating each of the N-substrate bias voltage and the P-substrate bias voltage are separately included, the area occupied within the semiconductor integrated circuit is not small.

Particularly, the ring oscillating unit and the voltage pumping unit each occupy large areas. Thus, the for duplicate circuits for generating the substrate bias voltages, which occupy large areas, make it difficult to achieve low power consumption as well as high integration.

SUMMARY

An apparatus for generating internal voltages in a semiconductor integrated circuit that increases area efficiency.

According to one aspect, an apparatus for generating an internal voltage in a semiconductor integrated circuit comprises a first voltage generating unit configured to detect a feedback voltage level of a first internal voltage and perform a pumping operation, thereby generating a first internal voltage, and a second voltage generating unit configured to generate a second internal voltage by detecting a feedback voltage level of the second internal voltage, performing level shifting on the detected feedback voltage level, receiving the first internal voltage, and generating the second internal voltage based on the level shifted feedback voltage signal and the received first internal voltage.

According to another aspect, an apparatus for generating an internal voltage in a semiconductor integrated circuit comprises a voltage pumping unit configured to generate a first internal voltage through a voltage pumping operation, a detecting unit configured to detect a level of a second internal voltage, thereby generating a detecting signal, a level shifter configured to control a voltage level of the detecting signal, thereby generating a driving control signal, and a driving unit configured to drive the first internal voltage in response to the driving control signal, thereby generating the second internal voltage.

According to still another aspect, an apparatus for generating an internal voltage in a semiconductor integrated circuit comprises a first detecting unit configured to detect a level of a fed back N-substrate bias voltage, thereby generating a first detecting signal, a voltage pumping unit configured to perform pumping operation in response to the first detecting signal, thereby generating a N-substrate bias voltage, a second detecting unit configured to detect a level of a fed back P-substrate bias voltage, thereby generating a second detecting signal, a level shifter configured to control a voltage level of the second detecting signal, thereby generating a driving control signal, and a driving unit configured to adjust the N-substrate bias voltage in response to the driving control signal, thereby generating a P-substrate bias voltage.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
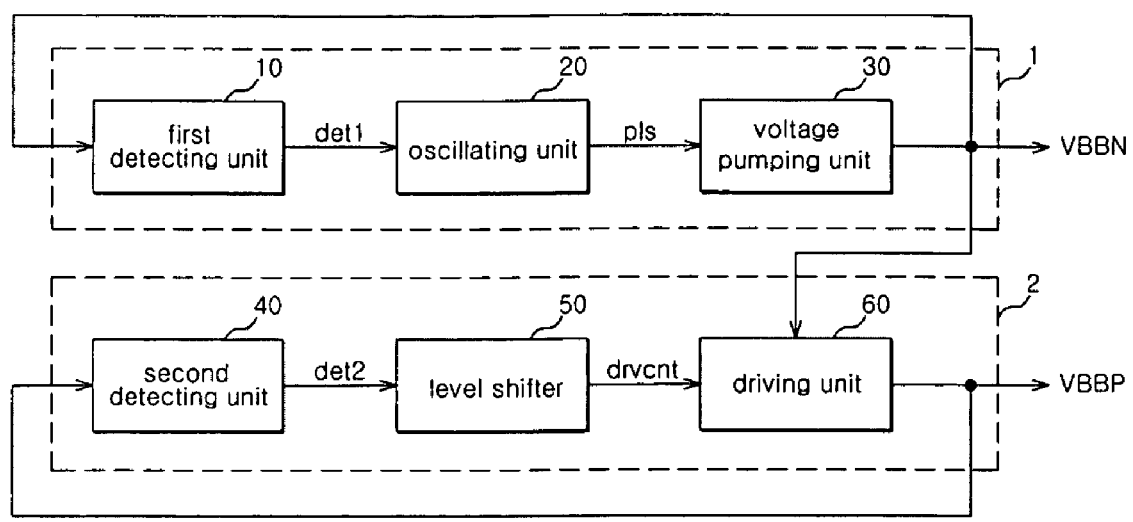
FIG. 1 is a block diagram illustrating an apparatus for generating an internal voltage in a semiconductor integrated circuit according to an embodiment.

FIG. 1 is a block diagram illustrating an example apparatus 11 for generating an internal voltage in a semiconductor integrated circuit according to one embodiment. Hereinafter, the internal voltage is referred to as a substrate bias voltage VBB. As shown in FIG. 1, the apparatus 11 can include a first detecting unit 10, an oscillating unit 20, a voltage pumping unit 30, a second detecting unit 40, a level shifter 50 and a driving unit 60.

The first detecting unit 10 can be configured to detect a fed back level of an N-substrate bias voltage VBBN, thereby generating a first detecting signal 'det1'. That is, if the level of the fed back N-substrate bias voltage VBBN is lower than a pre-set target level (that is, if an absolute value of the N-substrate bias voltage VBBN is larger than that of the pre-set target level), then the first detecting unit 10 disables the first detecting signal 'det1', and if the level of the fed back N-substrate bias voltage VBBN is higher than the pre-set target level (that is, if an absolute value of the N-substrate bias voltage VBBN is smaller than that of the pre-set target level), then the first detecting unit 10 enables the first detecting signal 'det1'.

The second detecting unit 40 can be configured to detect a level of a fed back P-substrate bias voltage VBBP, thereby generating a second detecting signal 'det2'. That is, if the level of the fed back P-substrate bias voltage VBBP is lower than a pre-set target level (that is, if an absolute value of the P-substrate bias voltage VBBN is larger than that of the pre-set target level), then the second detecting unit 40 disables the second detecting signal 'det2', and if the level of the fed back P-substrate bias voltage VBBP is higher than the pre-set target level (that is, if an absolute value of the N-substrate bias voltage VBBN is smaller than that of the pre-set target level), then the second detecting unit 40 enables the second detecting signal 'det2'.

At this time, depending on the embodiment, the target level of the N-substrate bias voltage VBBN can be set to be lower than that of the P-substrate bias voltage VBBP.

The oscillating unit 20 can be configured to perform an oscillating operation in response to the first detecting signal 'det1', thereby generating a pulse signal 'pls'. That is, when the first detecting signal 'det1' is enabled, the oscillating unit 20 can be configured to perform an oscillating operation, thereby enabling the pulse signal 'pls'. Then, the voltage pumping unit 30 can be configured to perform a voltage pumping operation in response to the pulse signal 'pls', thereby generating the N-substrate bias voltage VBBN.

The level shifter 50 can be configured to adjust and control a voltage level of the second detecting signal 'det2', thereby generating a driving control signal 'drvcnt'. That is, when the second detecting signal 'det2' is enabled, the level shifter 50 can be configured to perform a level shifting operation on the second detecting signal 'det2', thereby enabling the driving control signal 'drvcnt'.

Then, the driving unit 60 can be configured to generate the P-substrate bias voltage VBBP by driving the N-substrate bias voltage VBBN, in response to the driving control signal 'drvcnt'. That is, when the driving control signal 'drvcnt' is enabled, the driving unit 60 can be configured to reduce the level of the P-substrate bias voltage VBBP by receiving (supplying) the voltage level of the N-substrate bias voltage VBBN, and when the driving control signal 'drvcnt' is disabled, the driving unit 60 can be configured to not receive the N-substrate bias voltage VBBN.

Here, the first detecting unit 10, the oscillating unit 20 and the voltage pumping unit 30 can be referred to as a first voltage generating unit 1. Also, the second detecting unit 40, the level shifter 50 and the driving unit 60 can be referred to as a second voltage generating unit 2.

Although in the example presented here the internal voltage is referred to as the substrate bias voltage VBB, the internal voltage can be any of the internal voltages generated through a voltage pump, such as an elevated voltage VPP. Accordingly, the embodiments described herein should not be seen as limited to producing certain internal voltages and not others.

Further, while the apparatus 11 for generating a substrate bias voltage in a semiconductor integrated circuit is illustrated as generating two substrate bias voltages using one voltage pumping unit. It is possible to generate three or more substrate bias voltages as required by a particular implementation. Even in such a case, since only one voltage pumping unit is used, the occupied area should still not be greatly increased.

Figure 2:
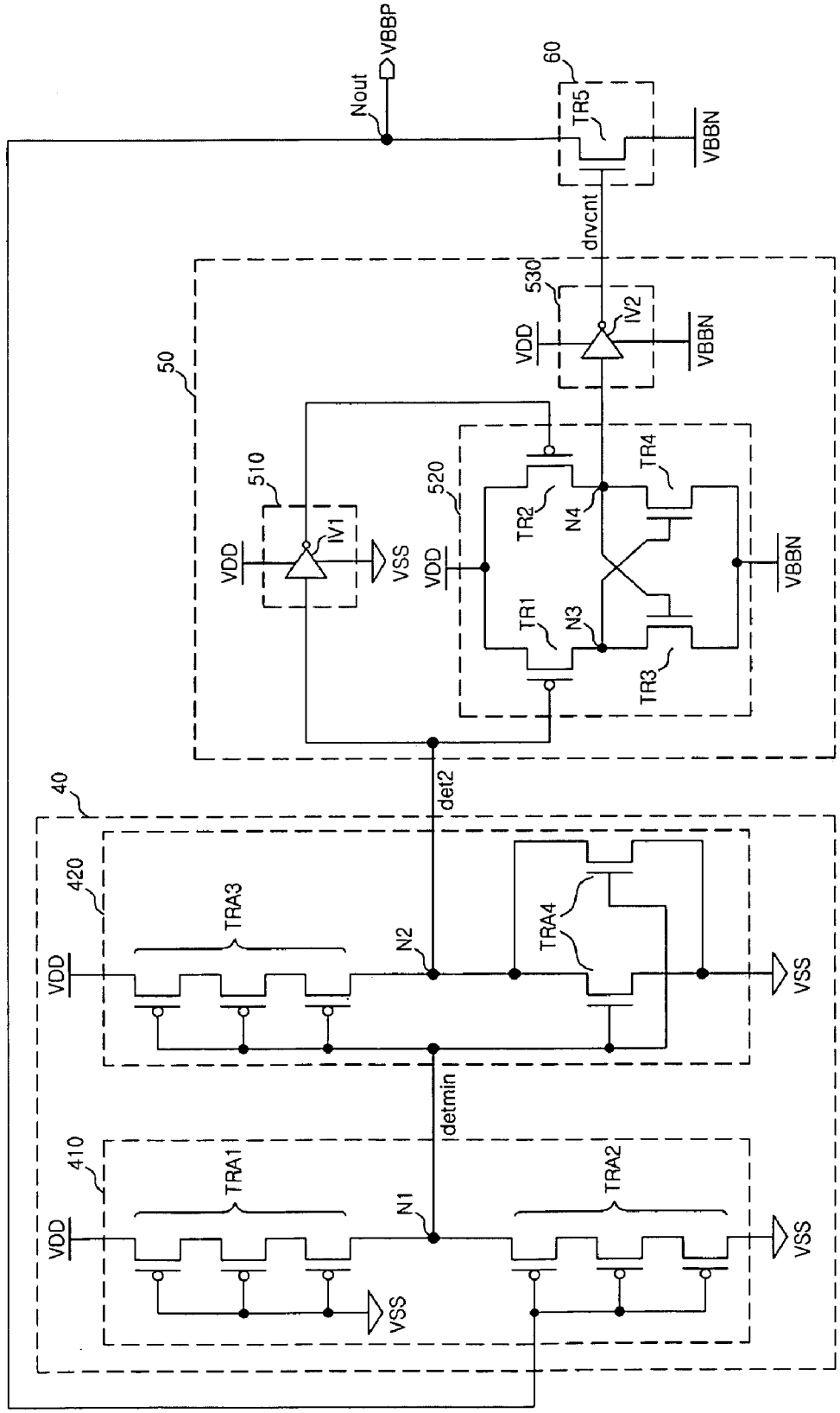
FIG. 2 is a detailed circuit diagram illustrating a second voltage generating unit that can be included in the apparatus of FIG. 1.

Referring to FIG. 2, as described above, the second voltage generating unit 2 can include the second detecting unit 40, the level shifter 50 and the driving unit 60.

The second detecting unit 40 can include a first detecting section 410 can be configured to generate a delicate detecting signal 'detmin', the voltage level of which changes according to the level of the P-substrate bias voltage VBBP, and a second detecting section 420 can be configured to generate the second detecting signal 'det2' by detecting the level change of the delicate detecting signal 'detmin'.

The first detecting section 410 can include a first transistor array TRA1, in which a plurality of transistors are connected in series between the supply terminal of the external supply voltage VDD and a first node N1 and have gates connected to the ground terminal, and a second transistor array TRA2, in which a plurality of transistors are connected in series between the first node N1 and the ground terminal and have gates supplied with the P-substrate bias voltage VBBP. A voltage signal applied to the first node N1 can be output as a delicate detecting signal 'detmin'.

The second detecting section 420 can include a third transistor array TRA3, in which a plurality of transistors are connected in series between the supply terminal of the external supply voltage VDD and a second node N2 and have gates configured to receive the delicate detecting signal 'detmin', a fourth transistor array TRA4, in which a plurality of transistors are connected in parallel between the second node N2 and the ground terminal and have gates configured to receive the delicate detecting signal 'detmin'. A voltage signal applied to the second node N2 can be output as a second detecting signal 'det2'.

The level shifter 50 can include a first inverting section 510, which can be configured to invert the second detecting signal 'det2', a differential amplifying section 520 which can be configured to differentially amplify the second detecting signal 'det2' and an output signal of the first inverting section 510, and a second inverting section 530, which can be configured to invert an output signal of the differential amplifying section 520, thereby outputting the driving control signal 'drvcnt'.

Here, the first inverting section 510 can include a first inverter IV1, which can be configured to use the external supply voltage VDD and a ground voltage VSS as a power source and to receive the second detecting signal 'det2'.

The differential amplifying section 520 can include a first transistor TR1, a second transistor TR2, and a third transistor TR3 and a fourth transistor TR4. The first transistor TR1 can include a gate configured to receive the second detecting signal 'det2', a source coupled with the supply terminal of the external supply voltage VDD and a drain coupled with a third node N3. The second transistor TR2 can include a gate configured to receive the output signal of the first inverting section 510, a source coupled with the supply terminal of the external supply voltage VDD and a drain coupled with a fourth node N4. The third transistor TR3 can include a gate coupled with the fourth node N4, a drain coupled with the third node N3 and a source coupled with the supply terminal of the N-substrate bias voltage VBBN. The fourth transistor TR4 can include a gate coupled with the third node N3, a drain coupled with the fourth node N4 and a source coupled with the supply terminal of the N-substrate bias voltage VBBN. A voltage signal applied to the fourth node N4 can be output as an output signal of the differential amplifying section 520.

Also, the second inverting section 530 can include a second inverter IV2, which can be configured to use the external supply voltage VDD and the N-substrate bias voltage VBBN as a power source and to receive the output signal of the differential amplifying section 520.

The driving unit 60 can include a fifth transistor TR5 having a gate receiving the driving control signal 'drvcnt', a drain coupled with an output node Nout and a source applied with the N-substrate bias voltage VBBN.

If the level of the P-substrate bias voltage VBBP rises, then the first detecting section 410 of the second detecting unit 40 can be configured to raise the voltage level of the delicate detecting signal 'detmin', and if the level of the P-substrate bias voltage VBBP falls, the first detecting section 410 can be configured to lower the voltage level of the delicate detecting signal 'detmin'. Depending on the embodiment, the level change of the delicate detecting signal 'detmin' does not have a discrete form.

If the voltage level of the delicate detecting signal 'detmin' rises, then the second detecting section 420 can be configured to enable the second detecting signal 'det2', and if the voltage level of the delicate detecting signal 'detmin' falls, then the second detecting section 420 can be configured to disable the second detecting signal 'det2'. The second detecting signal 'det2' can, e.g., be a low-enable signal.

If the second detecting signal 'det2' is enabled, then the level shifter 50 can be configured to enable the driving control signal 'drvcnt', and if the second detecting signal 'det2' is disabled, then the level shifter 50 can be configured to disable the driving control signal 'drvcnt'. For example, the driving control signal 'drvcnt' can be configured to swing from the level of the external supply voltage VDD to the level of the N-substrate bias voltage VBBN.

When the driving control signal 'drvcnt' is enabled, the driving unit 60 can be configured to supply the N-substrate bias voltage VBBN to the output node Nout, thereby lowering the level of the P-substrate bias voltage VBBP. Meanwhile, when the driving control signal 'drvcnt' is disabled, the driving unit 60 can be configured to block the supply of the N-substrate bias voltage VBBN to the output node Nout so that the P-substrate bias voltage VBBP has a level that is independent of the level of the N-substrate bias voltage VBBN.

Figure 3:
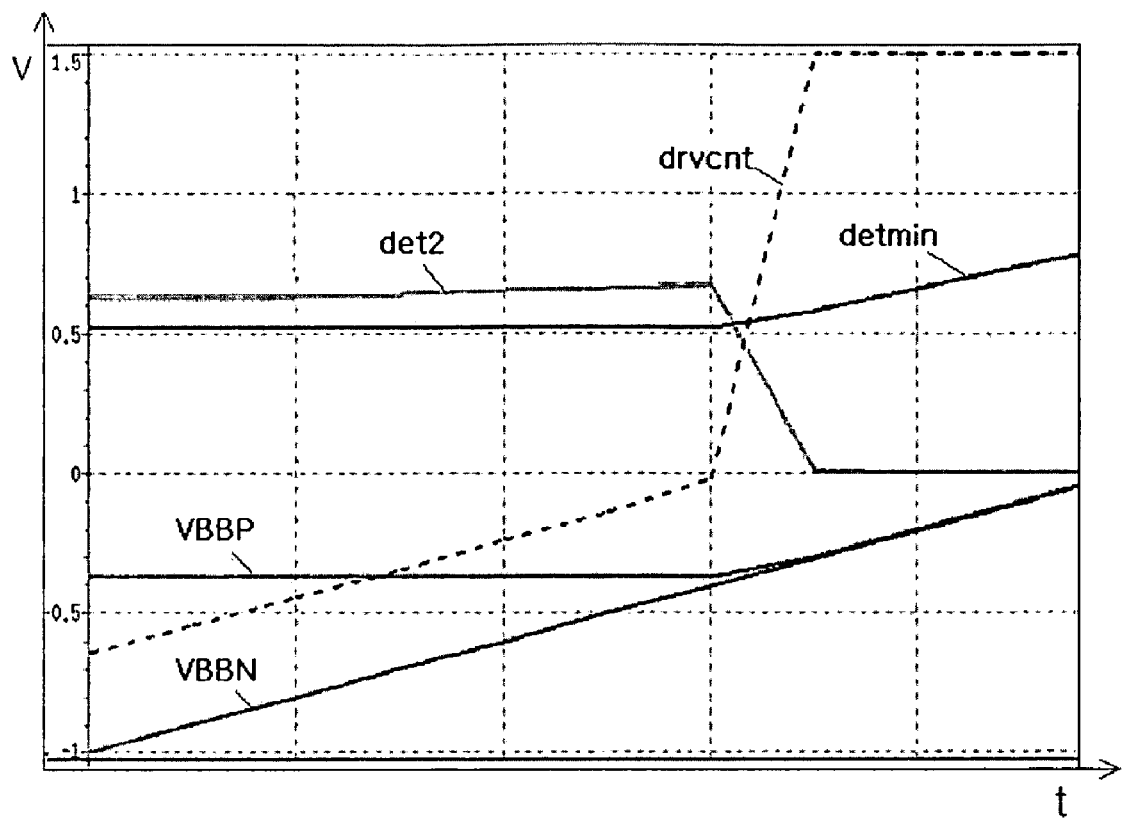
FIG. 3 is a graph illustrating the operation of the apparatus of FIG. 1.

FIG. 3 is a diagram showing the level changes of the P-substrate bias voltage VBBP, the delicate detecting signal 'detmin', the second detecting signal 'det2' and the driving control signal 'drvcnt' when the level of the N-substrate bias voltage VBBN is changed.

As can be seen, the level of the N-substrate bias voltage VBBN constantly rises until it reaches the level of the P-substrate bias voltage VBBP. After the level of the N-substrate bias voltage VBBN reaches the level of the P-substrate bias voltage VBBP, the levels of the N-substrate bias voltage VBBN and the P-substrate bias voltage VBBP rise simultaneously. As the level of the P-substrate bias voltage VBBP rises, the level of the delicate detecting signal 'detmin' also rises and the second detecting signal 'det2' is enabled at a low level. As the second detecting signal 'det2' is enabled, the driving control signal 'drvcnt' is also enabled.

Therefore, it will be understood that if the level of the P-substrate bias voltage VBBP is lower than the pre-set target level, the N-substrate bias voltage VBBN does not affect the P-substrate bias voltage VBBP, and if the level of the P-substrate bias voltage VBBP rises to be higher than the pre-set target level, the P-substrate bias voltage VBBP is generated by the supply of the N-substrate bias voltage VBBN. That is, both of the N-substrate bias voltage VBBN and the P-substrate bias voltage VBBP can be generated using only the single voltage pumping unit 30 for generating the N-substrate bias voltage VBBN.

Accordingly, the apparatus 11 for generating an internal voltage according to the embodiments described herein can include a single voltage pump to generate a plurality of internal voltages. Thus, it is possible for the internal voltage generating apparatus 11 to occupy a reduced area and to still generate the plurality of the internal voltages. Moreover, the embodiments described herein can also lead to lower power consumption, due to reduced circuitry, as well as higher integration.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An apparatus for generating a plurality of internal voltages in a semiconductor integrated circuit, the apparatus comprising:

a first voltage generating unit configured to generate a first internal voltage by detecting a feedback voltage level of the first internal voltage and performing a pumping operation based on the detected feedback voltage level to generate the first internal voltage; and a second voltage generating unit configured to generate a second internal voltage by detecting a feedback voltage level of the second internal voltage, performing level shifting on the detected feedback voltage level, receiving the first internal voltage, and generating the second internal voltage based on the level shifted feedback voltage signal and the received first internal voltage, wherein the second voltage generating unit includes:

a second detecting unit configured to detect the level of the fed back second internal voltage to thereby generate a second detecting signal;

a level shifter configured to control a voltage level of the second detecting signal when the second detecting signal is enabled to thereby generate a driving control signal; and a driving unit configured to receive the first internal voltage to control the level of the second internal voltage when the driving control signal is enabled, and to not receive the first internal voltage when the driving control signal is disabled.

2. The apparatus of claim 1, wherein the first voltage generating unit includes:

a first detecting unit configured to detect the level of the fed back first internal voltage to thereby generate a first detecting signal;

an oscillating unit configured to perform an oscillating operation in response to the first detecting signal to thereby generate a pulse signal; and a voltage pumping unit configured to perform a voltage pumping operation in response to the pulse signal to thereby generate the first internal voltage.

3. The apparatus of claim 1, wherein the second detecting unit is further configured to enable the second detecting signal when the level of the second internal voltage does not reach a target level and to disable the second detecting signal when the level of the second internal voltage reaches the target level.

4. The apparatus of claim 3, wherein the second detecting unit includes:
   a first detecting section configured to generate a delicate detecting signal a voltage level of which changes according to the level of the second internal voltage; and
   a second detecting section configured to generate the second detecting signal by detecting a level change of the delicate detecting signal.

5. The apparatus of claim 1, wherein the level shifter is further configured to enable the driving control signal when the second detecting signal is enabled, and wherein a swing width of the driving control signal is larger than a swing width of the second detecting signal.

6. The apparatus of claim 5, wherein the level shifter includes:
   a first inverting section configured to invert the second detecting signal;
   a differential amplifying section configured to differentially amplify the second detecting signal and an output signal of the first inverting section; and
   a second inverting section configured to invert an output signal of the differential amplifying section, thereby outputting the driving control signal.

7. The apparatus of claim 1, wherein the plurality of internal voltages are substrate bias voltages, and wherein the first internal voltage is lower than the second internal voltage.

8. The apparatus of claim 1, wherein at least one of the plurality of internal voltages is an elevated voltage, and wherein the first internal voltage is higher than the second internal voltage.

9. An apparatus for generating a plurality of internal voltages in a semiconductor integrated circuit, the apparatus comprising:
   a voltage pumping unit configured to generate a first internal voltage through a voltage pumping operation;
   a detecting unit configured to detect a level of a second internal voltage, thereby generating a detecting signal;
   a level shifter configured to control a voltage level of the detecting signal when the detecting signal is enabled, thereby generating a driving control signal; and
   a driving unit configured to receive the first internal voltage to control the level of the second internal voltage when the driving control signal is enabled, and to not receive the first internal voltage when the driving control signal is disabled.

10. The apparatus of claim 9, wherein the detecting unit is further configured to enable the detecting signal when the level of the second internal voltage does not reach a target level and to disable the detecting signal when the level of the second internal voltage reaches the target level.

11. The apparatus of claim 10, wherein the detecting unit includes:
    a first detecting section configured to generate a delicate detecting signal a voltage level of which changes according to the level of the second internal voltage; and
    a second detecting section configured to generate the detecting signal by detecting a level change of the delicate detecting signal.

12. The apparatus of claim 9, wherein the level shifter is further configured to enable the driving control signal when the detecting signal is enabled, and a swing width of the driving control signal is larger than a swing width of the detecting signal.

13. The apparatus of claim 12, wherein the level shifter includes:
    a first inverting section configured to invert the detecting signal;
    a differential amplifying section configured to differentially amplify the detecting signal and an output signal of the first inverting section; and
    a second inverting section configured to invert an output signal of the differential amplifying section, thereby outputting the driving control signal.

14. The apparatus of claim 9, wherein the plurality of internal voltages are substrate bias voltages, and wherein the first internal voltage is lower than the second internal voltage.

15. The apparatus of claim 9, wherein at least one of the plurality of internal voltages is an elevated voltage, and wherein the first internal voltage is higher than the second internal voltage.

16. An apparatus for generating a plurality of internal voltages in a semiconductor integrated circuit, the apparatus comprising:
    a first detecting unit configured to detect a level of a fed back N-substrate bias voltage to thereby generate a first detecting signal;
    a voltage pumping unit configured to perform a pumping operation in response to the first detecting signal to thereby generate the N-substrate bias voltage;
    a second detecting unit configured to detect a level of a fed back P-substrate bias voltage to thereby generate a second detecting signal;
    a level shifter configured to control a voltage level of the second detecting signal when the detecting signal is enabled to thereby generate a driving control signal; and
    a driving unit configured to receive the N-substrate bias voltage to control the level of the P-substrate bias voltage when the driving control signal is enabled, and to not receive the N-substrate bias voltage when the driving control signal is disabled.

* * * * *